(12) United States Patent
Shiraiwa et al.

(10) Patent No.: US 7,071,538 B1
(45) Date of Patent: Jul. 4, 2006

(54) ONE STACK WITH STEAM OXIDE FOR CHARGE RETENTION

(75) Inventors: Hidehiko Shiraiwa, San Jose, CA (US); Harpreet K. Sachar, Milpitas, CA (US); Mark Randolph, San Jose, CA (US); Wei Zheng, Santa Clara, CA (US)

(73) Assignee: Spansion,LLC, Sunnyvale, CA (US)

( * ) Notice: Subject to any disclaimer, the term of this patent is extended or adjusted under 35 U.S.C. 154(b) by 0 days.

(21) Appl. No.: 11/008,263

(22) Filed: Dec. 10, 2004

(51) Int. Cl.
*H01L 21/31* (2006.01)

(52) U.S. Cl. ............... 257/635; 257/636; 257/640; 257/645; 257/649; 438/763; 438/770; 438/773; 438/787

(58) Field of Classification Search ............ 438/660, 438/761, 763, 770, 773, 778, 787, 791, 954, 438/FOR. 395, FOR. 396, FOR. 408, FOR. 431; 257/632, 635, 636, 640, 645, 649, 701
See application file for complete search history.

(56) References Cited

U.S. PATENT DOCUMENTS

| 5,304,503 | A * | 4/1994 | Yoon et al. ............... 438/258 |
| 6,130,129 | A * | 10/2000 | Chen ........................ 438/257 |
| 6,190,979 | B1 * | 2/2001 | Radens et al. ............ 438/301 |
| 6,380,029 | B1 * | 4/2002 | Chang et al. ............. 438/257 |
| 2004/0086640 | A1 * | 5/2004 | Luo et al. ............... 427/248.1 |
| 2004/0232471 | A1 * | 11/2004 | Shukuri .................... 257/314 |
| 2005/0009276 | A1 * | 1/2005 | Rudeck .................... 438/264 |
| 2005/0142765 | A1 * | 6/2005 | Joo .......................... 438/264 |
| 2005/0227437 | A1 * | 10/2005 | Dong et al. .............. 438/265 |
| 2006/0017092 | A1 * | 1/2006 | Dong et al. .............. 257/314 |

* cited by examiner

*Primary Examiner*—George Fourson
*Assistant Examiner*—Joannie Adelle Gacia
(74) *Attorney, Agent, or Firm*—Harrity Snyder, LLP

(57) ABSTRACT

A semiconductor device includes a substrate that further includes source, drain and channel regions. The device may further include a bottom oxide layer formed upon the substrate, a charge storage layer formed upon the bottom oxide layer, and a steam oxide layer thermally grown upon the charge storage layer. The device may also include an alumina oxide layer formed upon the steam oxide layer and a gate electrode formed upon the alumina oxide layer.

18 Claims, 7 Drawing Sheets

ONE STACK WITH STEAM OXIDE FOR CHARGE RETENTION

TECHNICAL FIELD

The present invention relates generally to semiconductor devices and, more particularly, to the use of steam oxide in oxide-nitride-oxide (ONO) stacks in semiconductor devices.

BACKGROUND ART

In SONOS non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically.

Product development efforts in EEPROM device technology have focused on increasing the programming speed, lowering programming and reading voltages, increasing data retention time, reducing cell erasure times and reducing cell dimensions. One important dielectric material for the fabrication of an EEPROM device is an oxide-nitride-oxide (ONO) structure. One EEPROM device that utilizes the ONO structure is a silicon-oxide-nitride-oxide-silicon (SONOS) type device. Another EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon oxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

In a typical SONOS device, the top oxide layer of the ONO structure consists of deposited oxide. However, use of deposited oxide for the top oxide layer of the ONO structure results in degraded charge retention for the overall device that may impair the device's performance.

DISCLOSURE OF THE INVENTION

Consistent with aspects of the invention, a thermally grown steam oxide layer is used in an ONO structure in place of a conventional deposited oxide layer. The thermally grown steam oxide layer causes significant improvement in charge retention in the ONO structure.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a structure for use in a semiconductor device. The structure may include a first oxide layer and a charge storage layer formed upon the first oxide layer. The structure may further include a steam oxide layer thermally grown upon the charge storage layer.

According to another aspect of the invention, a method of forming a charge retention structure for a semiconductor device may include forming a first oxide layer upon a substrate and forming a charge storage layer upon the first oxide layer. The method may also include thermally growing an oxide layer upon the charge storage layer.

According to a further aspect of the invention, a memory device may include a substrate that further includes source, drain and channel regions and a bottom oxide layer formed upon the substrate. The semiconductor device may further include a charge storage layer formed upon the bottom oxide layer and a thermally grown oxide layer formed upon the charge storage layer. The semiconductor device may also include an alumina oxide layer formed upon the thermally grown oxide layer and a gate electrode formed upon the alumina oxide layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
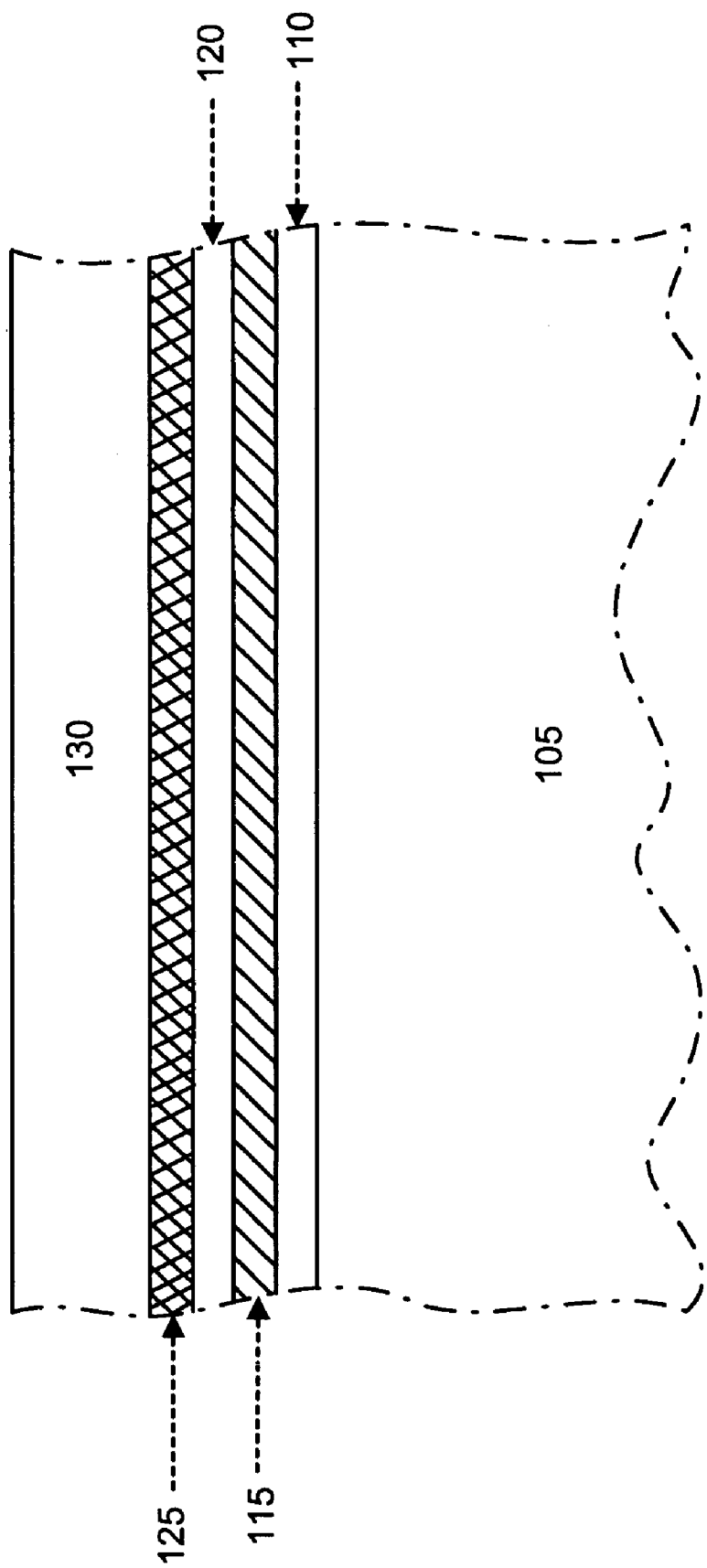
FIG. 1 illustrates a steam oxide layer thermally grown upon a charge storage layer in an ONO structure of a semiconductor device consistent with an aspect of the invention.

FIG. 1 illustrates a cross-section of a semiconductor substrate 105 according to an exemplary embodiment of the invention. Substrate 105, consistent with one aspect, may include a crystal silicon wafer. In other implementations, substrate 105 may include a gallium arsenide layer, a silicon-on-insulator structure, a silicon-germanium layer, or other conventional materials used to form a semiconductor substrate. A bottom oxide layer 110 may be formed on substrate 105. Bottom oxide layer 110 may be formed on substrate 105 using, for example, existing deposition processes, such as a chemical vapor deposition (CVD) process. Bottom oxide layer 110 may include oxide materials, such as, for example, silicon oxide, or silicon oxynitride. The thickness of bottom oxide layer 110 may range, for example, from about 35 Å to about 70 Å.

A charge storage layer 115 may be formed on bottom oxide layer 110 using, for example, existing deposition processes, such as conventional CVD processes. In one exemplary embodiment, charge storage layer 115 may include a nitride charge storage layer, such as, for example, silicon nitride. In other embodiments, charge storage layer 115 may include other known dielectric materials such as, for example, high dielectric constant (high K) dielectric materials, that may be used to store a charge. The thickness of charge storage layer 115 may range, for example, from about 40 Å to about 100 Å.

A top oxide layer 120 may be formed on charge storage layer 115. Top oxide layer 120 may include a thermally grown oxide material. For example, the semiconductor device including substrate 105, bottom oxide layer 110 and charge storage layer 115 illustrated in FIG. 1 may be subjected to a thermal oxidation process carried out in a water vapor or steam environment. The thermal oxidation may be carried out, for example, at a temperature ranging from about 900° C. to about 1000° C. in a steam environment for a period of about 30 minutes to about 70 minutes. As a result of the thermal oxidation, an oxide layer 120 is formed on the surface of charge storage layer 115. It should be understood that the particular temperature and duration of the thermal oxidation may vary based on the particular circuit requirements. Top oxide layer 120, also referred to herein as steam oxide layer 120, may include various oxide materials, such as, for example, silicon oxide or silicon oxynitride. The thickness of top oxide layer 120 may range, for example, from about 30 Å to about 60 Å. Optionally, an alumina oxide layer 125 may be formed on top oxide layer 120 using, for example, existing deposition processes. The thickness of alumina oxide layer 125 may range, for example, from about 70 Å to about 140 Å.

A control gate electrode layer 130 may be formed on alumina oxide layer 125, or on top oxide layer 120 if there is no alumina oxide layer 125, using existing deposition processes. Gate electrode layer 130 may include, for example, polysilicon, or metal such as TaN or TiN. The thickness of gate electrode layer 130 may range, for example, from about 1000 Å to about 2000 Å.

Figure 2:
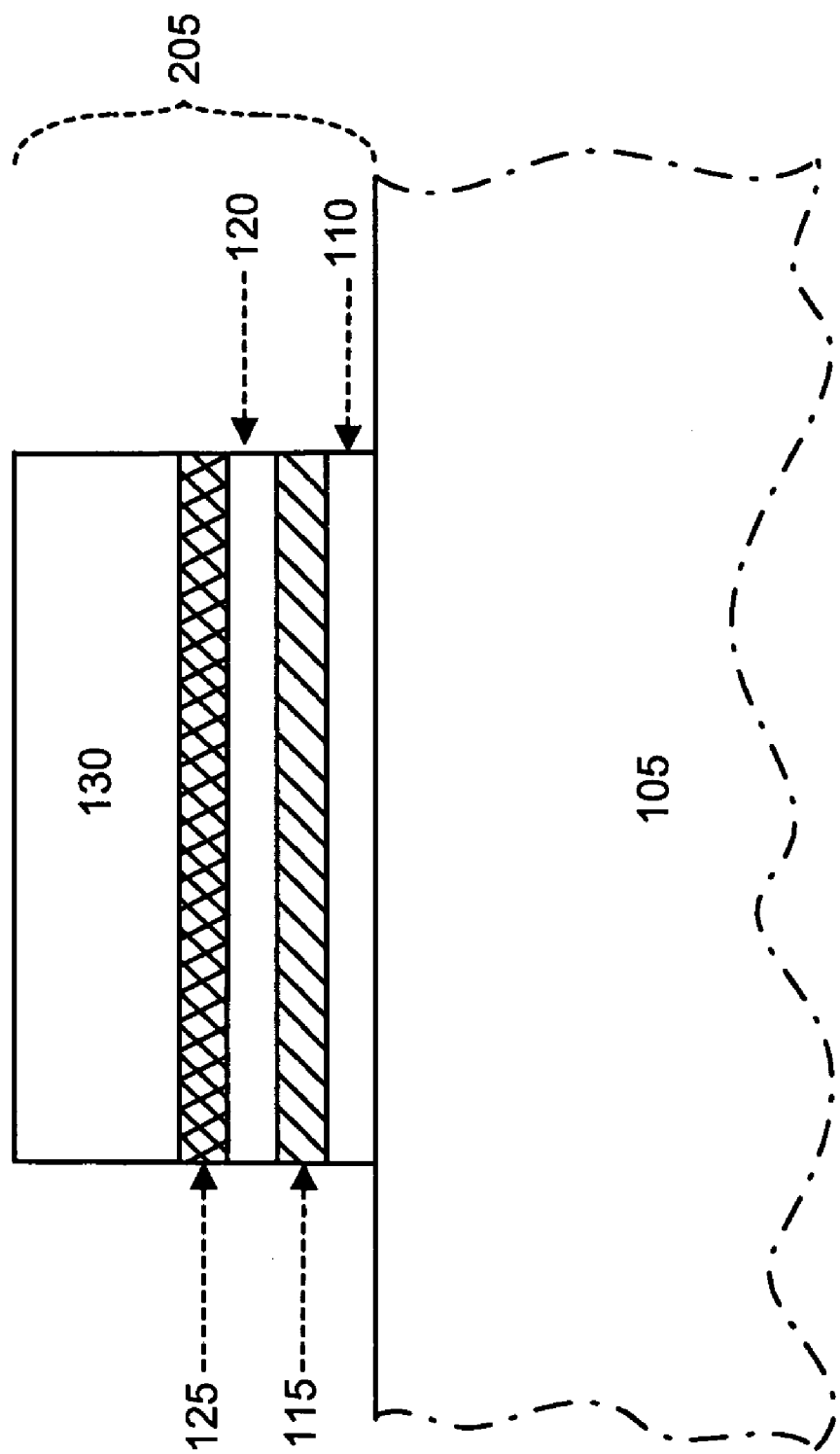
FIG. 2 illustrates etching of the layers of FIG. 1 to produce a gate structure consistent with an aspect of the invention.
Figure 3:
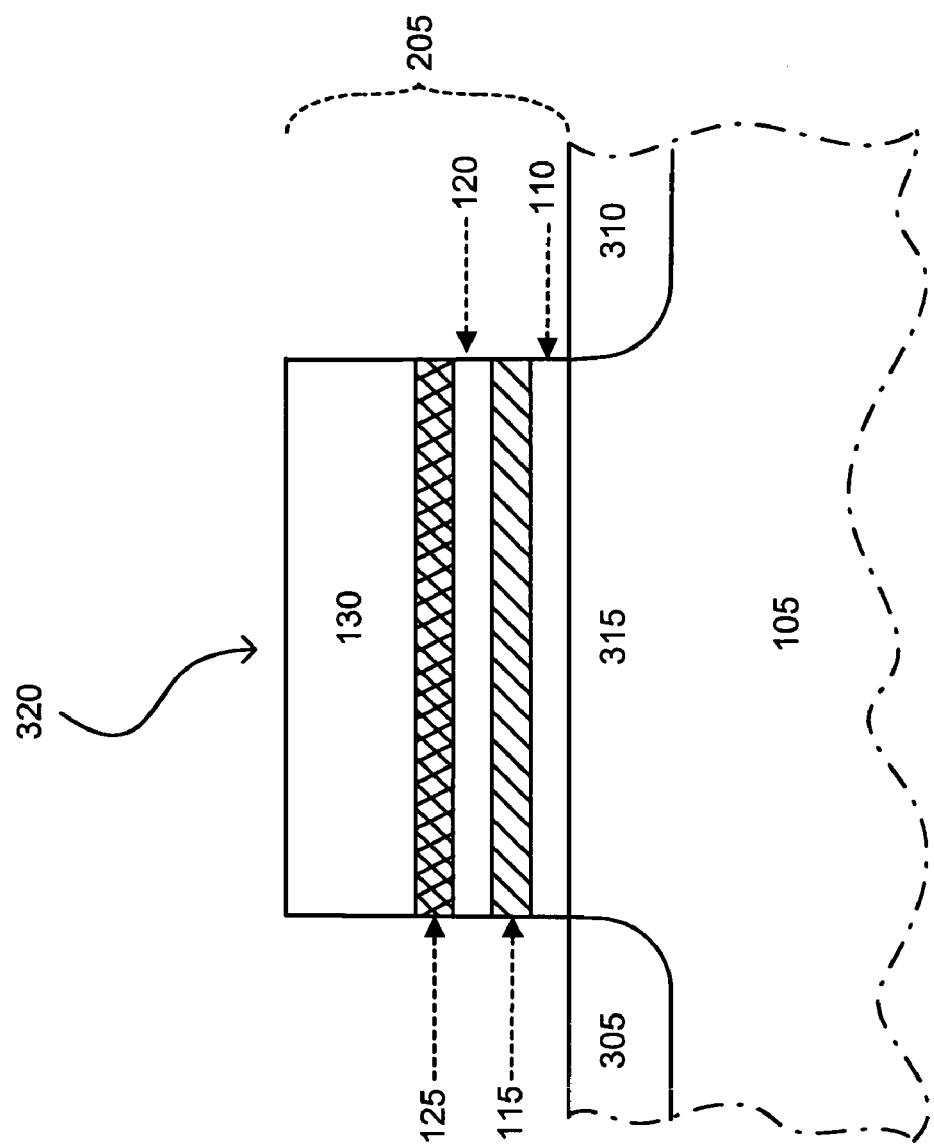
FIG. 3 illustrates the formation of source and drain regions adjacent the gate structure of FIG. 2 consistent with an aspect of the invention.
Figure 4A:
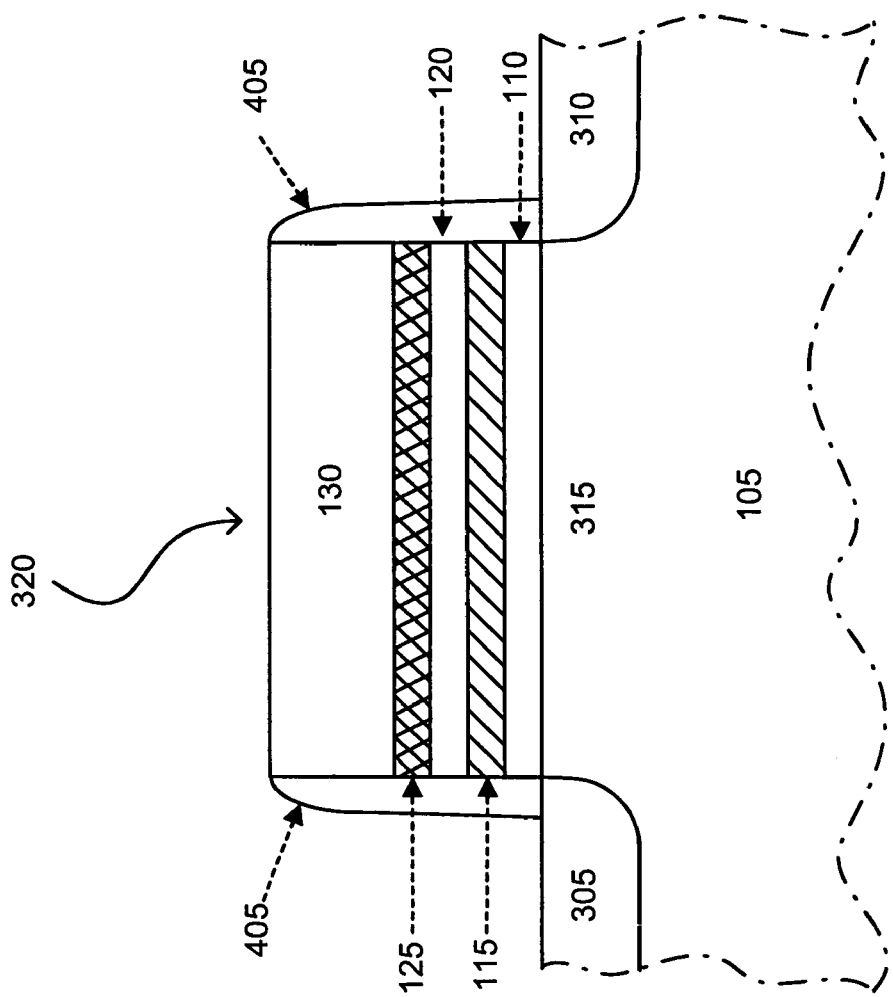
FIGS. 4A & 4B illustrate the formation of spacers adjacent the sidewalls of the gate structure of FIG. 3 consistent with an aspect of the invention.
Figure 4B:
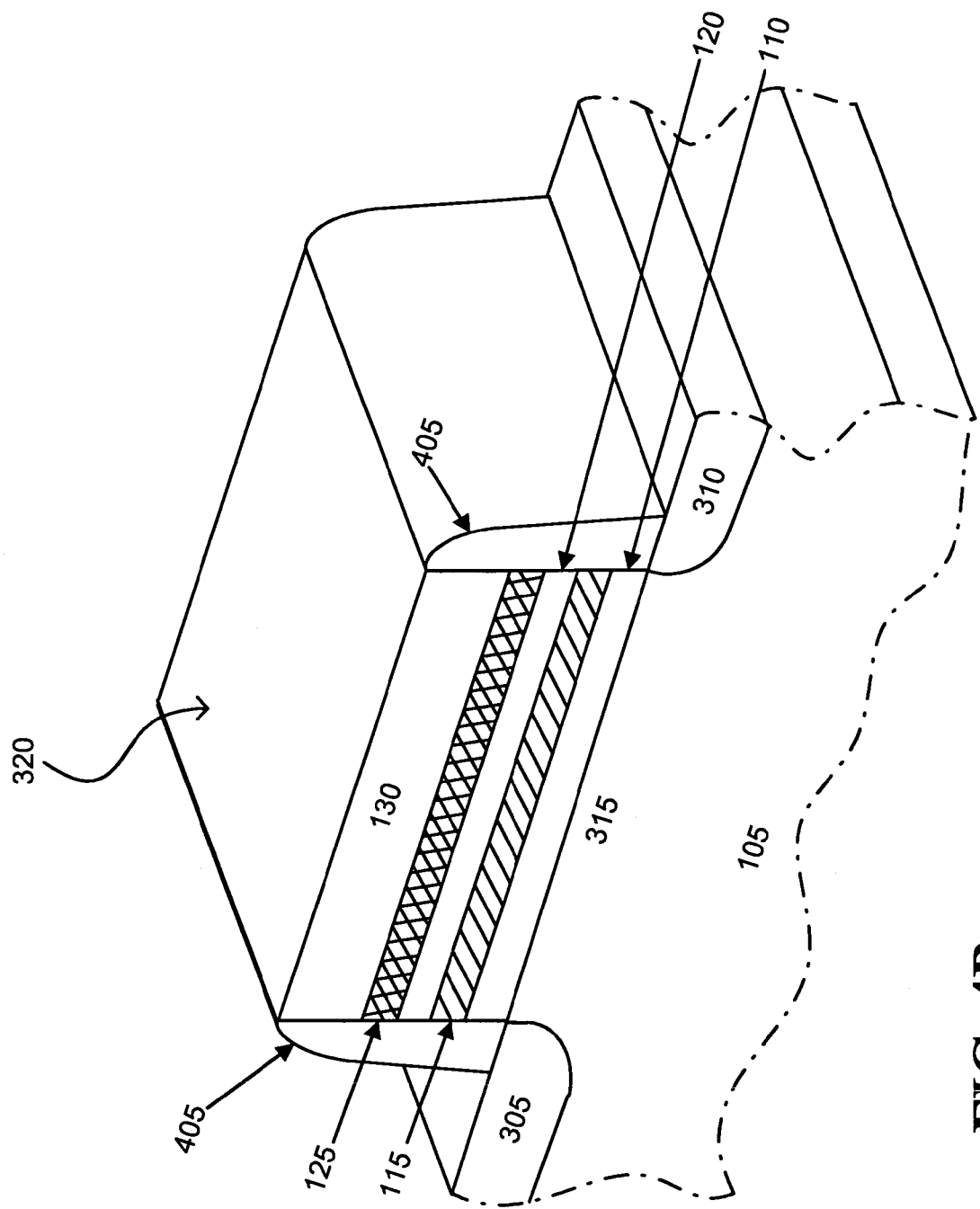

As shown in FIG. 2, layers 110, 115, 120, 125 and 130 may be etched, using existing photolithographic and etching processes, to form a gate structure 205. A source region 305 and a drain region 310 may then be formed in substrate 105, as shown in FIG. 3, to form a device 320, such as a SONOS type memory device. Source region 305 and drain region 310 may be doped with n-type or p-type impurities based on particular end device requirements. The particular implantation dosages and energy used to implant the impurities is not described herein in order not to unduly obscure the thrust of the invention. One of ordinary skill in the art, however, would be able to optimize the formation of source region 305 and drain region 310 based on the particular end device requirements. Formation of source region 305 and drain region 310 creates a channel region 315 in substrate 105 between the source region 305 and drain region 310. Sidewall spacers 405 may then be formed adjacent the vertical side surfaces of gate structure 205, as shown in FIGS. 4A and 4B. Spacers 405 may be formed of a dielectric material such as silicon oxide or silicon nitride. Spacers 405 may function to electrically isolate cells of a subsequently formed memory device from each other. The width and height of spacers 405 may be optimized based on the end device requirements.

Figure 5A:
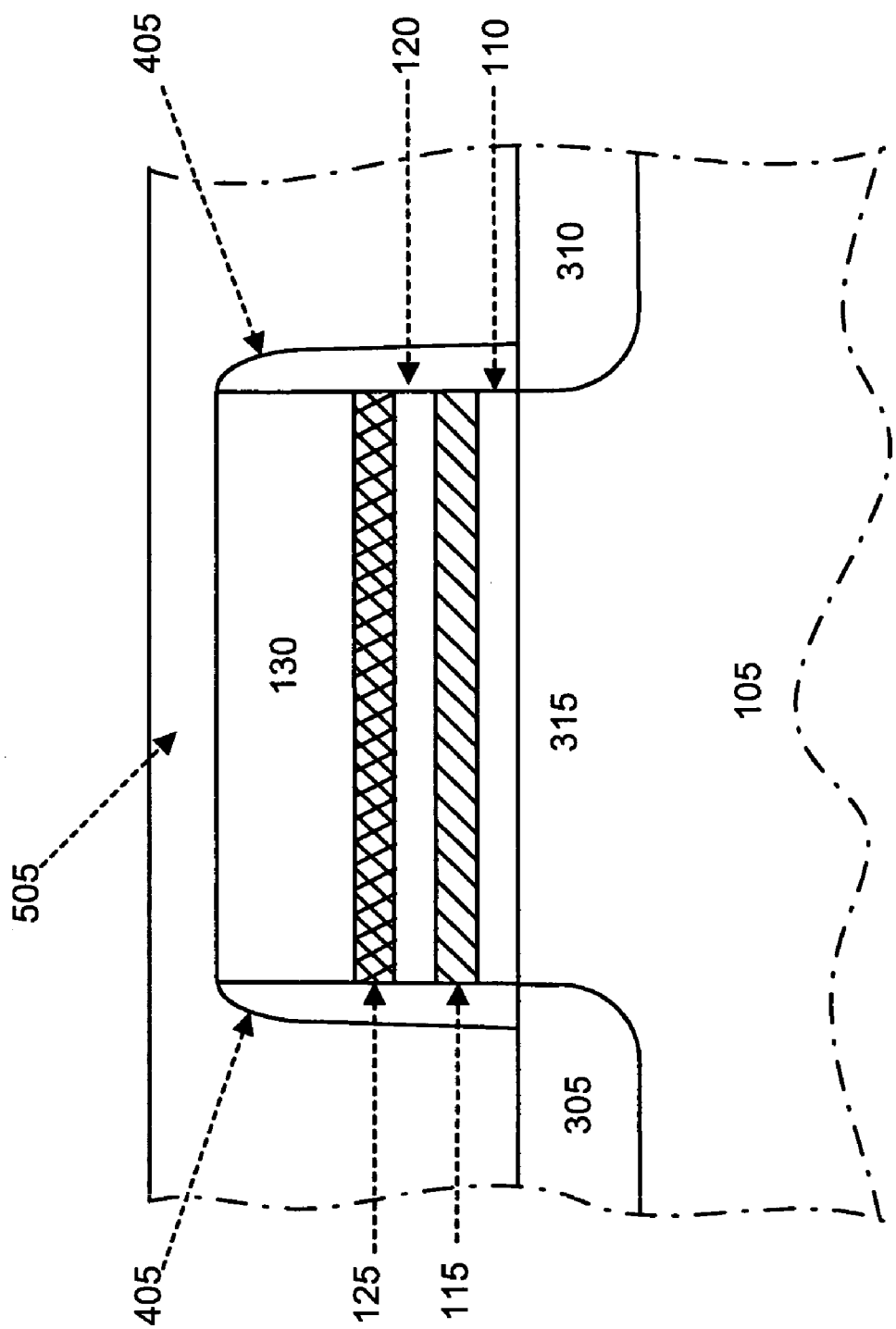
FIGS. 5A & 5B illustrate the formation of an interlayer dielectric over the gate structure of FIG. 3 consistent with an aspect of the invention.
Figure 5B:
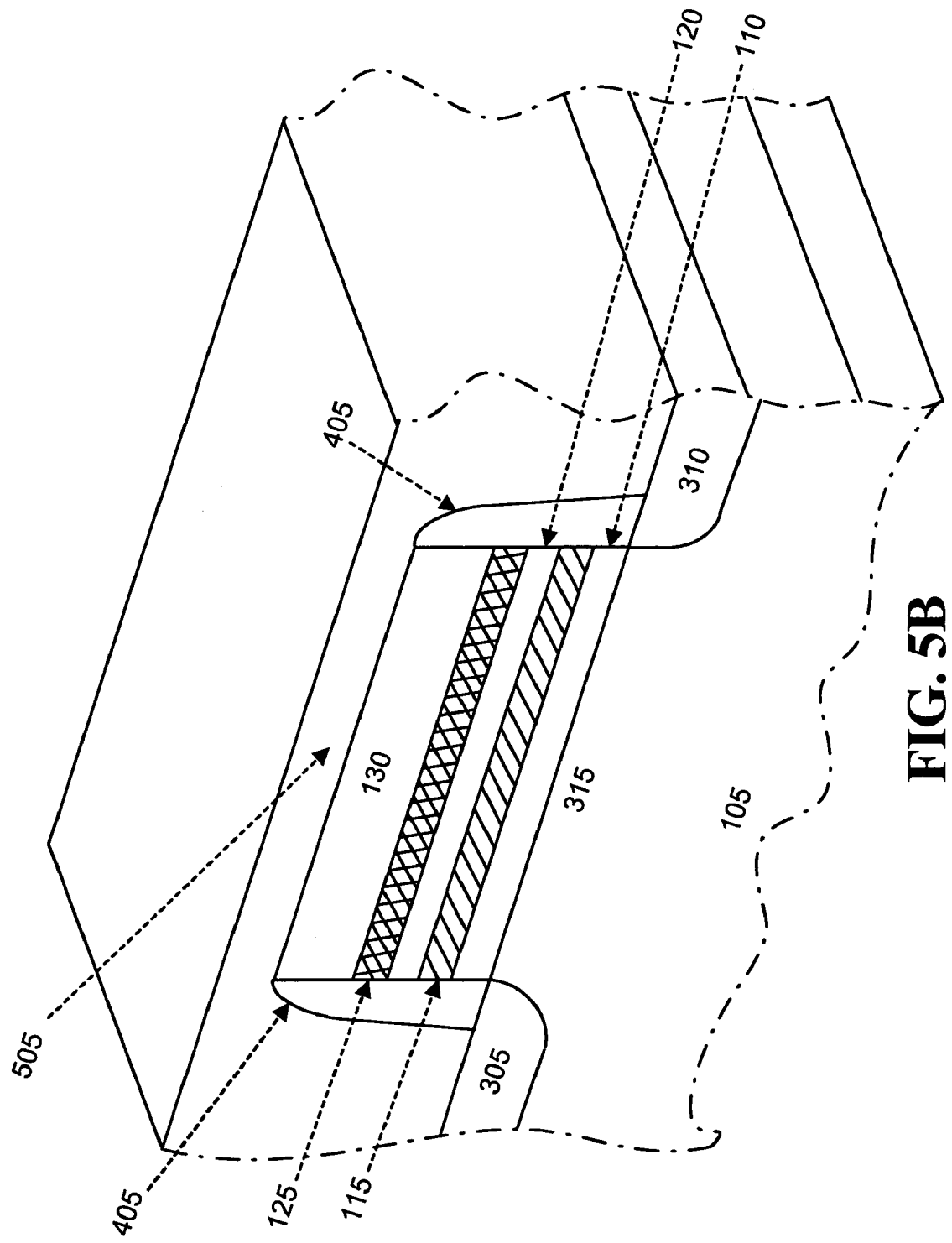

As shown in FIGS. 5A and 5B, an interlayer dielectric (ILD) 505 may be formed over device 320. ILD 505 may be formed over device 320 using, for example, existing deposition processes. ILD 505 may include, for example, tetra-ethylorthosilicate (TEOS), or any other dielectric material. In one exemplary implementation, ILD 505 may include a boro-phosphorous TEOS (BPTEOS). The thickness of ILD 505 may vary based on the size of device 320, or based on other design or fabrication parameters. In one exemplary embodiment, the thickness of ILD 505 may range from about 5000 Å to about 15000 Å. ILD 505 may be polished back to a planar surface using, for example, an existing chemical-mechanical polishing (CMP) process. A via (not shown) may then be formed in ILD 505, followed by deposition of a metal, such as copper or aluminum, to form a contact. An interconnect structure may then be formed to interconnect different components of device 320, or to interconnect device 320 with other devices (not shown).

In an exemplary implementation, device 320 illustrated in FIGS. 5A and 5B may represent a single memory cell in a non-volatile memory device. During operation of device 320, voltages may be applied to control gate electrode 130, source region 305 and drain region 310. The applied voltages may cause electrical charge from source region 305 and drain region 310 to propagate across channel region 315 and to tunnel from channel region 315 through bottom oxide layer 110 for retention in charge storage layer 115. The layered stack structure 205 that includes bottom oxide layer 110, charge storage layer 115, top oxide layer 120 and alumina oxide layer 125 permits Fowler-Nordheim (FN) erase in device 320, where the stored electric charge may be removed from charge storage layer 115 by tunneling back through bottom oxide layer 110 into the source/drain regions 305 and 310, or channel region 315.

Existing ONO stacks used conventionally deposited oxide for the top oxide layer of the ONO stack. However, degraded charge retention has been observed in stacks with deposited top oxide layers. Use of a thermally grown steam oxide layer for top oxide layer 120, consistent with aspects of the invention, leads to less leakage current, which, in turn, improves charge retention as compared to existing ONO stacks.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts has been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A structure for use in a semiconductor device, comprising:
   a first oxide layer;
   a charge storage layer formed upon the first oxide layer;
   a steam oxide layer thermally grown upon the charge storage layer; and
   an alumina oxide layer formed upon the steam oxide layer.

2. The structure of claim 1, wherein the charge storage layer comprises a nitride.

3. The structure of claim 2, wherein the nitride comprises silicon nitride.

4. The structure of claim 2, wherein the first oxide layer is formed upon a substrate comprising silicon.

5. The structure of claim 4, further comprising:
   a gate electrode formed adjacent the steam oxide layer, wherein the gate electrode comprises silicon.

6. The structure of claim 4, further comprising:
   source, drain and channel regions formed within the substrate.

7. The structure of claim 5, wherein the semiconductor device comprises a silicon-oxide-nitride-oxide-silicon (SONOS) memory device.

8. The structure of claim 1, wherein the alumina oxide layer has a thickness ranging from about 70 Å to about 140 Å.

9. The structure of claim 1, wherein the steam oxide layer has a thickness ranging from about 30 Å to about 60 Å.

10. A method of forming a charge retention structure for a semiconductor device, comprising:
    forming a first oxide layer upon a substrate;
    forming a charge storage layer upon the first oxide layer;
    thermally growing an oxide layer upon the charge storage layer in a water vapor or steam environment; and
    forming an alumina oxide layer upon the thermally grown oxide layer.

11. The method of claim 10, wherein the charge storage layer comprises a nitride.

12. The method of claim 11, wherein the nitride comprises silicon nitride.

13. The method of claim 10, wherein the substrate comprises silicon.

14. The method of claim 10, further comprising:
    forming a control gate electrode on the thermally grown oxide layer, wherein the control gate electrode comprises silicon.

15. The method of claim 10, wherein the oxide layer is thermally grown to a thickness ranging from about 30 Å to about 60 Å.

16. A memory device, comprising:
    a substrate comprising source, drain and channel regions;
    a bottom oxide layer formed upon the substrate;
    a charge storage layer formed upon the bottom oxide layer;
    a thermally grown oxide layer formed upon the charge storage layer;
    an alumina oxide layer formed upon the thermally grown oxide layer; and
    a gate electrode formed upon the alumina oxide layer.

17. The memory device of claim 16, wherein the charge storage layer comprises a nitride layer.

18. The memory device of claim 16, wherein the thermally grown oxide layer is formed in a steam environment.

* * * * *

UNITED STATES PATENT AND TRADEMARK OFFICE
CERTIFICATE OF CORRECTION

PATENT NO.       : 7,071,538 B1
APPLICATION NO.  : 11/008263
DATED            : July 4, 2006
INVENTOR(S)      : Hidehiko Shiraiwa et al.

It is certified that error appears in the above-identified patent and that said Letters Patent is hereby corrected as shown below:

On the first page of the patent, in item (54), "ONE" should be "ONO."

In column 1, line 1, "ONE" should be "ONO."

Signed and Sealed this

Fifth Day of September, 2006

JON W. DUDAS
*Director of the United States Patent and Trademark Office*